United States Patent

[11] 3,633,093

[72] Inventors Leroy N. Templeton, Jr.
Sherborn;
Paul J. Grant, Natick; Daniel D. Strassberg,
Arlington, all of Mass.

[21] Appl. No. 51,487
[22] Filed July 1, 1970
[45] Patented Jan. 4, 1972
[73] Assignee Honeywell, Inc.
Minneapolis, Minn.

[54] AMPLIFIER OVERLOAD PROTECTION CIRCUIT
17 Claims, 3 Drawing Figs.

[52] U.S. Cl. .................................................. 323/9, 307/202, 317/16, 330/103, 330/207 P
[51] Int. Cl. .................................................. G05f 1/10, H02h 9/00
[50] Field of Search .......................................... 330/207 P, 103; 317/13, 16, 20, 31; 307/202; 323/4, 9

[56] References Cited

UNITED STATES PATENTS

| | | | |
|---|---|---|---|
| 3,538,445 | 11/1970 | Brennen ........................ | 330/103 |
| 3,187,224 | 6/1965 | Massena ........................ | 317/16 |
| 3,250,919 | 5/1966 | Maass ........................... | 323/9 X |

*Primary Examiner*—Gerald Goldberg
*Attorneys*—Fred Jacob and Leo Stanger

ABSTRACT: An amplifier connected in the voltage follower mode which includes a current-limiting circuit in the feedback loop. The circuit increases in impedance as an overload condition develops and a semiconductor network decreases in impedance under the same conditions so as to preserve the voltage follower mode of the amplifier while uncoupling a load therefrom. The overload protection is also shown with a programmable gain amplifier as well as with another amplifier having overload protection so as to provide a differential input amplifier circuit.

PATENTED JAN 4 1972

3,633,093

INVENTORS
LEROY N. TEMPLETON, JR.
DANIEL D. STRASSBERG
PAUL J. GRANT
BY
John S. Solakian
ATTORNEY

AMPLIFIER OVERLOAD PROTECTION CIRCUIT

BACKGROUND OF THE INVENTION

1. Field of the Invention

The present invention relates generally to amplifier circuits and more particularly to means for providing overload protection for such amplifier circuits.

2. Description of the Prior Art

Amplifiers and especially operational amplifiers are frequently used as components in data acquisition systems. Such systems usually also include an analog multiplexer which sequentially connects the output of a number of transducers to the amplifier input. If a transducer is defective or one of the system's input connections is improperly wired, the amplifier will be overloaded when the defective channel is selected. After an overload occurs, the recovery time of the amplifier usually causes the data obtained on the next several channels to be in error. In many applications, such as process control, these errors are intolerable.

To prevent such errors a fast overload recovery circuit is necessary. Many such circuits have been developed for operational amplifiers. Some of such circuits are shown in the publication entitled "Philbrick Researchers Inc. Applications Manual for Computing Amplifiers," 1966, p. 23. However, these overload protection circuits or as referred to therein, bound circuits, are not usable in many applications, especially where very high input impedance is required. To obtain high input impedance it is necessary to connect an amplifier in the noninverting feedback configuration. In addition, many prior art overload protected amplifiers are complex in nature and remain subject to damage under certain overload conditions. Furthermore, they do not prevent amplifier saturation, and the attendant slow recovery from the saturated condition under conditions where excessive current is drawn from the amplifier output causing overheating and thermal recovery times to become a factor.

It is therefore an object of the invention to provide an improved amplifier overload protection circuit.

It is another object of the invention to provide a simplified and fast recovery overload-protected amplifier circuit having a high input impedance.

It is a further object of the invention to provide an overload-protected amplifier circuit having a programmable gain.

It is still a further object of the invention to provide a differential input amplifier circuit having very high input impedance and common mode rejection ratio as well as high speed and rapid recovery from differential input voltages greater than the maximum full scale input.

SUMMARY OF THE INVENTION

The purposes and objects of the invention are satisfied by providing an amplifier overload protection circuit comprising an amplifier having noninverting and inverting inputs and an output, the noninverting input coupled to receive an input signal; circuit load means; current-limiting means coupled between the output of said amplifier and said circuit load means, the current-limiting means comprising a diode bridge so arranged that each of the diodes therein is forward biased when the output current is below a predetermined value, thereby providing a low-impedance path between the output and the circuit load means; means for coupling the junction of the limiting means and the circuit load means to the inverting input of the amplifier; a semiconductor circuit coupled between the output of the amplifier and the inverting input of the amplifier the semiconductor circuit providing a high-impedance path when the output current is below a predetermined value; and wherein as the circuit load means begins to draw an overload current from the amplifier greater than said predetermined value, the diode bridge increasingly provides a high-impedance path and the semiconductor circuit increasingly provides a low-impedance path so that the feedback coupling to the inverting input of the amplifier changes from said junction to the amplifier output.

BRIEF DESCRIPTION OF THE DRAWINGS

The advantages of the foregoing configuration of the present invention becomes more apparent upon reading the accompanying detailed description in conjunction with the figures in which.

DETAILED DESCRIPTION OF THE PREFERRED EMBODIMENTS

Figures 1, 2:
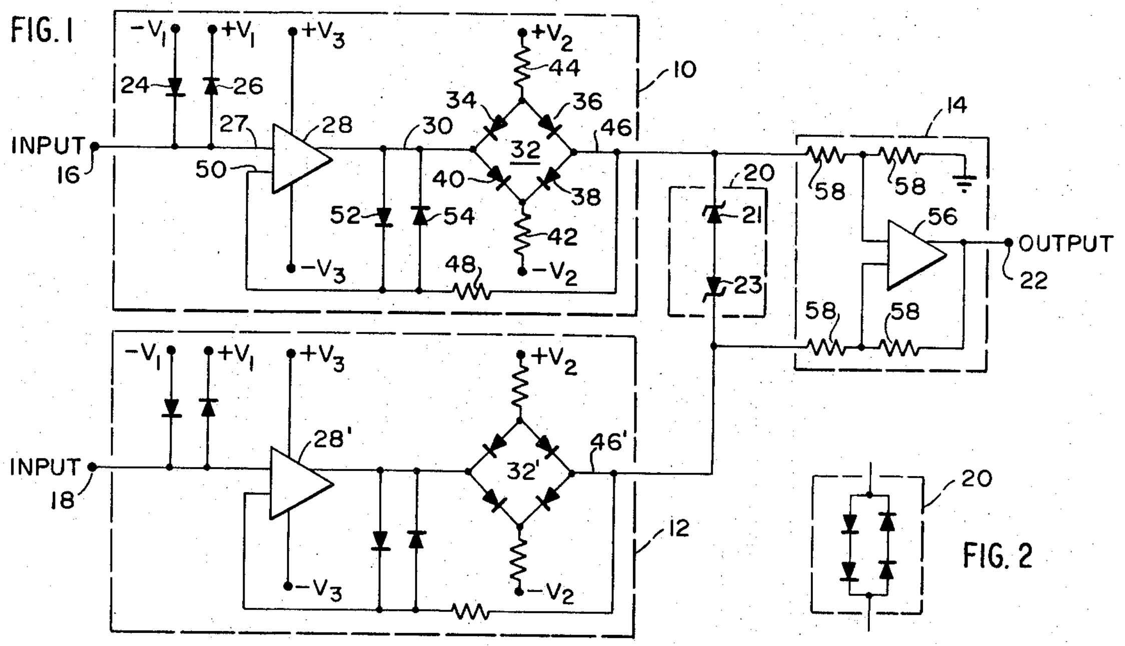
FIG. 1 is a schematic diagram illustrating the overload-protected amplifier circuit in a unity gain differential input to a single ended output circuit configuration.
FIG. 2 illustrates an alternate voltage clamp circuit configuration which may be utilized with the circuit of FIG. 1.

FIG. 1 illustrates the overload protected amplifier circuit 10 of the invention in combination with another similar overload protected amplifier circuit 12. A voltage clamp circuit 20 and a differential input to single-ended output amplifier circuit 14 are coupled to the differential output of combined circuits 10 and 12. Input terminals 16 and 18 provide a differential input and terminal 22 provides the output of the circuit shown in FIG. 1. Since the overload-protected amplifier circuits 10 and 12 are identical, only circuit 10 will be discussed.

Clamp diodes 24 and 25 are provided so that the input signal received at terminal 16 will be limited to the supply voltages $\pm V_1$. Amplifier 28, powered by supply voltages $\pm V_3$, is coupled to receive the input signal at its noninverting input 27 and provides an output on line 30. Output line 30 is coupled to the input of a current limiter circuit 32 which is comprised of diodes 34, 36, 38, and 40 and resistors 42 and 44. The current limiter circuit 32 is powered by supply voltages $\pm V_2$ and develops an output on line 46. The plus and minus supply voltages $V_1$, $V_2$, and $V_3$ may be derived from the same power sources respectively and in a preferred embodiment, supply voltage $V_2$ is greater than the supply voltage $V_3$, which turn is greater than the supply voltage $V_1$.

The values of $+V_2$ and $-V_2$ produce sufficiently small DC currents in the diodes 34, 36, 38, and 40 so that the diodes constitute low impedances to low-level signals. However, the voltages $+V_2$ and $-V_2$ produce sufficiently large currents in the diodes 34 and 40 so that signals beyond a given amplitude cause two of the diodes to be back-biased and exhibit high impedances. In addition, the output line 46 of circuit 32 is coupled to a resistor 48 which is coupled at its other end to the inverting input 50 of amplifier 28. Also coupled between output line 30 and input 50 are two diodes 52 and 54, connected in parallel in opposing easy current flow directions.

The operation of overload-protected amplifier circuit 10 will now be discussed. Diodes 24 and 26 prevent a signal received at input terminal 16 from becoming greater than the potential $V_1$. When the current drawn from amplifier 28 is below a predetermined value, the diodes of current limiter circuit 32 are forward biased, thereby presenting a very low impedance between lines 30 and 46. The amplifier circuit 28 is thereby connected in a voltage follower mode because of the substantially direct coupling between lines 30 and 46 and the inverting input 50 via resistor 48. Also, when the output current is below such predetermined value, diodes 52 and 54 are each biased with essentially zero anode to cathode voltage, thereby presenting a very high impedance or open circuit.

As the output current increases, opposite and noncontiguous diodes of circuit 32 become reversed biased. For example, when the current goes above a predetermined value and is of a positive polarity, diodes 34 and 38 become reverse biased. Circuit 32 thereby increasingly presents a higher impedance between lines 30 and 46. Under the same conditions, one of the diodes 52 and 54 becomes increasingly forward biased. For the positive input current, diode 52 becomes forward biased. Accordingly, the voltage follower configuration of amplifier 28 is maintained while a load connected to line 46 is substantially uncoupled from the circuit. The amplifier 28 is shown with a gain of one, and it will be seen with reference to FIG. 3, that for a gain greater than one, diodes 52 and 54 will be replaced by a transistor circuit. Resistor 48 is utilized between line 46 and input 50 in order to maintain a given potential difference so that diodes 52 and 54 will not become forward biased.

In combination, the circuits 10 and 12 provide a differential input overload protected amplifier circuit. In this combination, a voltage clamp circuit 20 is connected between the current limiter circuit output lines 46 and 46'. Also, each input to circuits 10 and 12 is protected against a common mode overload by the diode clamp circuits at the inputs. It will be noted that these clamps cannot prevent the differential current on lines 46 and 46' from increasing to a point that the circuit 14 would saturate. Circuit 14 may be any appropriate load circuit and by way of example includes an amplifier 56 with four resistors 58, which are connected to provide a well known differential input to signal ended output, amplifier configuration. Amplifier 56 may be powered by a supply voltage producing voltage $+V_3$ and $-V_3$. In order to prevent amplifier 56 from saturating, back to back zener diodes 21 and 23 in voltage clamp circuit 20 are utilized. If the closed loop gain of amplifier 56 is set to be higher than four, it is usually practical to replace the zener diodes with conventional diodes as shown in FIG. 2. Two diodes in series and in parallel with two other diodes in series are shown. However, any combination of diodes such as simply two diodes connected in parallel but opposing easy current flow directions may be utilized. The criterion is that the diode drops multiplied by the closed loop differential gain of amplifier 56 should be greater than the linear voltage swing required of amplifier 56, but less than the output voltage at which amplifier 56 saturates.

In operation, when the zener diodes 21 and 23 begin to conduct so as to limit the differential voltage, they increase the current drain from the output of amplifiers 28 and 28'. This current, however, is then limited by the current limiter circuits 32 and 32'. When such circuits start to limit the voltage across them increases and eventually forward biases one diode of the diode pairs between line 30 and input 50 of both circuits 10 and 12. This closes the loop around amplifiers 28 and 28' from a point inside the current limiters thus preventing the amplifier from saturating. Thus the voltage clamp circuit 20 prevents the differential input to circuit 14 from saturating amplifier 56.

It can also be seen that the overload protection provided for the voltage follower configured circuit 10 may also have been provided for the circuit 14. That is, a current limiter circuit 32 may have been provided between the output of amplifier 56 and output terminal 22 wherein the feedback connection to the inverting input of amplifier 56 would be connected to terminal 22. Also, the overload feedback loop such as diodes 52 and 54 between the output of amplifier 56 but inside the current limiter circuit would be provided but in transistorized form as shown in FIG. 3.

It can be seen that the output impedance of amplifiers 28 and 38' increase by utilizing the overload-protected amplifier circuit of the invention. In addition, in normal operation, the current limiters inside the feedback loop where their offset and nonlinearity are attenuated by the open loop gain of the respective amplifiers 28 and 28'. The advantage of using a technique where the series resistance required for voltage limiting at the input of an amplifier, such as amplifier 56, is provided by a nonlinear network within the loop of amplifiers 28 and 28' is that limiting is much more abrupt than that which would be produced if the series resistance were passive components following amplifiers 28 and 28'. Thus the limiting scheme does not adversely affect linearity. Also, leakage in the limiting elements between lines 46 and 46' does not cause offset or gain inaccuracy because until limiting occurs, the closed-loop output impedance of amplifiers 28 and 28' is very low due to feedback. It can also be seen that the overload protection circuit is not limited to voltage follower circuits but may be used with amplifiers providing gain.

Figure 3:
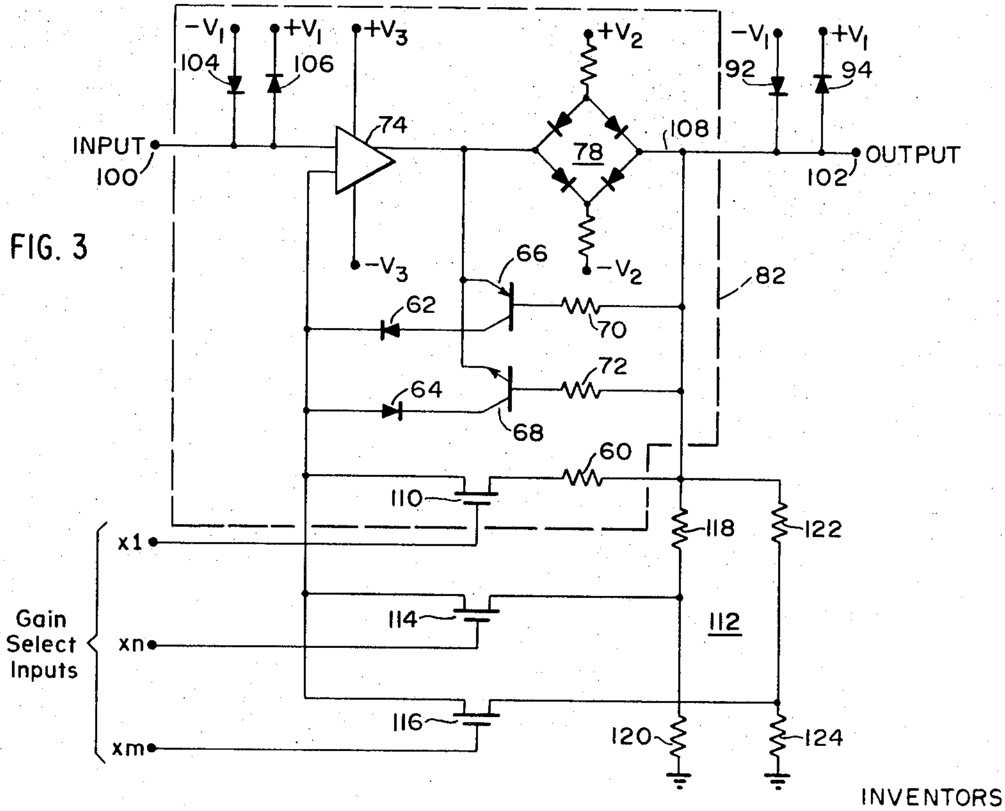
FIG. 3 illustrates the overload-protected amplifier circuit of the invention in a programmable voltage gain mode configuration.

FIG. 3 illustrates a programmable gain overload protected amplifier circuit having an overload protected amplifier circuit 82 which includes an input terminal 100 and an output terminal 102. As was the case for the basic circuit 10, diodes 104 and 106 are utilized to clamp the input signal at the potential level of $V_1$. The signal is coupled into the noninverting input of amplifier 74, whose output is connected to a current limiter circuit 78 similar to the current limiter circuit 32 of FIG. 1. The output of current limiter circuit 78 is clamped by diodes 92 and 94. Because the gain of amplifier 74 is expected to be greater than one, the diodes 52 and 54 of circuit 10, shown in FIG. 1, are replaced by the combination of transistors 66 and 68 and diodes 62 and 64. This is necessary because otherwise with the amplifier 74 whose gain may be greater than one, the diode arrangement similar to diodes 52 and 54, could become forward biased in normal operation. The diodes 62 and 64 are utilized to isolate the collectors of transistors 66 and 68 from each other. Resistors 70 and 72 are utilized to bias transistors 66 and 68 respectively.

In operation, when the output voltage on line 108 exceeds the normal range, the output clamping diodes 92 and 94 prevent further change in the amplifier output voltage. However, this demands large currents from the amplifier output. These large currents cause the current limiter circuit 78 to begin its action. When this happens, the voltage across the current limiter circuit 78 increases and causes one of the two transistor base-emitter junctions, depending upon the polarity of the input signal, to become forward biased, thereby establishing feedback from inside the current limiter circuit 78.

In order to select the gain of the circuit 82, one of the gain select inputs X1, X*n*, X*m* is energized. If the X1 gain select input is energized then a switch 110, which is preferably a MOS field effect transistor, is closed so that the line 108 is connected via a resistor 60 to the inverting input of amplifier 74. In this case, resistor 60 serves the same function as did the resistor 48 of the circuit 10 in FIG. 1. For a gain greater than one, the impedance network 112 is utilized in combination with the other switches 114 and 116. The impedance network 112 is comprised of resistors 118, 120, 122, and 124 which are appropriately connected to switches 114 and 116 and a potential shown as circuit ground. For example, selection of the gain select input X*n* couples the junction of resistors 118 and 120 to the inverting input of amplifier 74 in which case the output voltage is represented by the ratio of resistors 118 and 120, plus 1, all times the value of the input signal. Thus, the amplifier 74 is protected against excessive voltage swings as well as current drain and regardless of how many programmable gains are provided, no additional overload protection components are required.

It should be understood that various combinations of the circuits shown in FIGS. 1, 2, and 3 may have been utilized. For example, if the gain of the amplifiers in FIG. 1 are to be greater than one, then the circuit 82 of FIG. 3 may have been utilized in their place. In addition, other modifications may have been made without departing from the scope of the invention.

Having now described the invention what is claimed as new and novel and which it is desired to secure Letters Patent is:

1. An amplifier overload protection circuit comprising:

A. a first amplifier having inverting and noninverting inputs and an output;

B. circuit load means, wherein said circuit load means comprises variable impedance means whose impedance value remains above a specified value until a predetermined voltage appears across said variable impedance means and which variable impedance means lowers in impedance value once said predetermined voltage is exceeded, and wherein said variable impedance means includes a first plurality of diodes connected in series and a second plurality of diodes connected in series, said first and second plurality of diodes connected in parallel, said first plurality of diodes connected in a first easy current flow direction and said second plurality of diodes connected in a second easy current flow direction opposite that of said first plurality of diodes;
C. current-limiting means coupled between said amplifier output and said circuit load means for increasingly limiting current drawn by said circuit load means from said amplifier output as said current exceeds a predetermined value;
D. coupling means for coupling the junction of said current-limiting means and said circuit load means to said inverting input; and
E. feedback means connected between said amplifier output and said inverting input for decreasing impedance between said output and said inverting input as said current exceeds said predetermined value, whereby the coupling to said inverting input changes from said junction to said output as said current exceeds said predetermined value.

2. An amplifier overload protection circuit comprising:
A. a first amplifier having inverting and noninverting inputs and an output;
B. circuit load means;
C. current-limiting means coupled between said amplifier output and said circuit load means for increasingly limiting current drawn by said circuit load means from said amplifier output as said current exceeds a predetermined value, said current-limiting means comprising a diode bridge comprising four diodes so arranged that each of said diodes is forward biased when said current is less than said predetermined value and so that opposite, noncontiguous diodes become increasingly reverse biased as said current exceeds said predetermined value;
D. coupling means for coupling the junction of said current limiting means and said circuit load means to said inverting input; and
E. feedback means connected between said amplifier output and said inverting input for decreasing impedance between said output and said inverting input as said current exceeds said predetermined value, whereby the coupling to said inverting input changes from said junction to said output as said current exceeds said predetermined value.

3. A circuit as defined in claim 2 wherein said feedback means includes at least one diode connected between said output and said second input so that said diode is forward biased when said current is greater than said predetermined value and so that said diode provides a high impedance when said current is less than said predetermined value.

4. A circuit as defined in claim 3 wherein said amplifier is an operational amplifier, said operational amplifier having a feedback path to said inverting input regardless of the value of said current.

5. A circuit as defined in claim 2 wherein said feedback means includes at least one transistor having a base, a collector, and an emitter, said base coupled to said junction of said current-limiting means and said circuit load means, said collector coupled to said second input and said emitter connected to said output.

6. A circuit as defined in claim 5 further including a diode connected between said collector and said second input.

7. A circuit as defined in claim 6 further including an impedance coupled between said junction and said base.

8. A circuit as defined in claim 5 wherein said amplifier is an operational amplifier and further including:
A. switch means; and
B. impedance means, said switch means and impedance means coupled together and with said operational amplifier to provide said operational amplifier with a programmable voltage gain depending on the gain selection by said switch means.

9. An amplifier overload protection circuit comprising:
A. a first amplifier having inverting and noninverting inputs and an output;
B. circuit load means;
C. current-limiting means coupled between said amplifier output and said circuit load means for increasingly limiting current drawn by said circuit load means from said amplifier output as said current exceeds a predetermined value;
D. coupling means for coupling the junction of said current-limiting means and said circuit load means to said inverting input;
E. feedback means connected between said amplifier output and said inverting input for decreasing impedance between said output and said inverting input as said current exceeds said predetermined value, whereby the coupling to said inverting input changes from said junction to said output as said current exceeds said predetermined value;
F. a second amplifier similar to said first amplifier;
G. a second means for limiting, similar to said first means for limiting;
H. a second feedback means, similar to said first feedback means;
I. a second coupling means for coupling, similar to said first means for coupling;
J. wherein said noninverting input of said first and second amplifiers provide a differential input; and
K. wherein said circuit load means includes a semiconductor circuit coupled to receive current from both said first and second current-limiting means, said semiconductor circuit providing a high impedance when the differential value between said currents is below said predetermined value, and said semiconductor circuit providing a low impedance when said differential value is above said predetermined value.

10. A circuit as defined in claim 9 wherein said semiconductor circuit includes first and second zener diodes each having an anode and a cathode, said anodes connected together and each said cathodes coupled to one of said current limiting means.

11. A circuit as defined in claim 9 wherein said diode circuit includes at least a first diode connected in parallel with at least a second diode, said diodes having anodes and cathodes, wherein the cathode of said first diode is connected to the anode of said second diode and to one of said current-limiting means, the other ends of said diodes connected together and to the other of said current-limiting means.

12. An amplifier overload protection circuit comprising:
A. an amplifier having inverting and noninverting inputs and an output, said noninverting input coupled to receive a signal;
B. an output circuit having an input;
C. current-limiting means coupled between said output and said input of said output circuit, said current-limiting means comprising a diode bridge so arranged that each of said diodes is forward biased when current from said amplifier output is below a predetermined value thereby providing a low-impedance path from said output to said output circuit input;
D. coupling means for coupling said output circuit input to said inverting input;
E. a semiconductor circuit coupled between said output and said inverting input, said semiconductor circuit providing a high impedance path when said current is below said predetermined value; and
F. wherein as said output circuit begins to draw an overload current from said amplifier, said diode bridge provides a high impedance path and said semiconductor circuit provides a low-impedance path so that the feedback coupling to said inverting input changes from said output circuit input to said amplifier output.

13. A circuit as defined in claim 12 wherein said semiconductor circuit includes first and second diodes connected between said output and said inverting input so that said first diode is forward biased when said current is a first polarity and is greater than said predetermined value and so that said second diode is forward biased where said signal is a second polarity and is greater than said predetermined value and so that both of said diodes provide a high impedance when said current is less than said predetermined value.

14. A circuit as defined in claim 12 wherein said semiconductor circuit includes first and second complementary transistors, each of said transistors having a base, an emitter, and a collector, said bases coupled to said output circuit input, said emitters coupled to said output, and said collectors coupled to said inverting input so that the emitter-collector path of one of said transistors is forward biased when said current is greater than said predetermined value.

15. A circuit as defined in claim 14 further including first and second diodes connected in the easy current flow direction from said collectors of said first and second transistors respectively, to said inverting input.

16. A circuit as defined in claim 14 further including means for selecting the voltage gain of said amplifier, said means for selecting comprising:

A. a plurality of switch means;

B. first and second impedance networks arranged between said output circuit input, a first potential and by way of said plurality of switch means to said inverting input so as to result in a voltage amplifier configuration; and C. wherein a voltage gain is selected by activation of one of said plurality of switch means.

17. A circuit as defined in claim 12 wherein said means for coupling includes an impedance means.

* * * * *